United States Patent
Menkhoff et al.

(10) Patent No.: US 8,218,683 B2
(45) Date of Patent: Jul. 10, 2012

(54) METHOD FOR COMPENSATION FOR ANY PHASE AND/OR AMPLITUDE ERROR IN A RECEIVER

(75) Inventors: Andreas Menkhoff, Oberhaching (DE); Bernhard Aumayer, Perg (AT)

(73) Assignee: Infineon Technologies AG, Neubiberg (DE)

( * ) Notice: Subject to any disclaimer, the term of this patent is extended or adjusted under 35 U.S.C. 154(b) by 1307 days.

(21) Appl. No.: 11/773,211

(22) Filed: Jul. 3, 2007

(65) Prior Publication Data

US 2008/0008269 A1 Jan. 10, 2008

(30) Foreign Application Priority Data

Jul. 3, 2006 (DE) .................. 10 2006 030 582

(51) Int. Cl.
*H04L 27/06* (2006.01)
(52) U.S. Cl. .................... 375/316; 375/345
(58) Field of Classification Search .............. 375/147, 375/219, 261, 298, 316, 319, 322, 324, 329, 375/344, 349, 269, 273, 308, 323, 345; 329/304–306, 308; 455/136, 139, 324, 334, 455/130, 131, 323
See application file for complete search history.

(56) References Cited

U.S. PATENT DOCUMENTS

| | | | |
|---|---|---|---|
| 5,705,949 A * | 1/1998 | Alelyunas et al. | 329/304 |
| 6,122,325 A * | 9/2000 | Mogre et al. | 375/261 |
| 6,340,883 B1 * | 1/2002 | Nara et al. | 324/76.78 |
| 6,892,060 B2 * | 5/2005 | Zheng | 455/302 |
| 7,010,059 B2 * | 3/2006 | Song et al. | 375/316 |
| 7,020,220 B2 * | 3/2006 | Hansen | 375/324 |
| 7,130,359 B2 * | 10/2006 | Rahman | 375/316 |
| 7,474,711 B2 * | 1/2009 | Ruelke et al. | 375/319 |
| 7,529,313 B2 * | 5/2009 | Naito et al. | 375/271 |
| 2003/0095589 A1 | 5/2003 | Jeong | |
| 2003/0135532 A1 * | 7/2003 | Peting | 708/622 |
| 2004/0203472 A1 * | 10/2004 | Chien | 455/68 |
| 2006/0039506 A1 * | 2/2006 | D'Alessandro | 375/324 |
| 2006/0251189 A1 * | 11/2006 | Ruelke et al. | 375/329 |
| 2006/0291590 A1 * | 12/2006 | Elahi et al. | 375/332 |
| 2008/0253477 A1 * | 10/2008 | Dalipi | 375/297 |
| 2011/0075715 A1 * | 3/2011 | Kravitz | 375/221 |
| 2011/0140771 A1 * | 6/2011 | Liao | 327/557 |
| 2011/0143701 A1 * | 6/2011 | Caruthers et al. | 455/311 |

OTHER PUBLICATIONS

Yu et al., A Novel Adaptive Mismatch Cancellation System for Quadraure IF Receivers, 1999, Circuits and Systems II: Analog and Digital Signal Processing, IEEE Transaction on, vol. 46; Issue: 6, pp. 789-801.*

Chabloz et al., A Novel Mismatch Compensation Scheme for a Low-IF Receiver Front-End, 2004, Circuits and Systems, 2004, ISCAS '04. Proceedings of the 2004 International Symposium on, vol. 4, pp. 453-456.*

(Continued)

*Primary Examiner* — Tesfaldet Bocure
*Assistant Examiner* — Lawrence Williams
(74) *Attorney, Agent, or Firm* — Eschweiler & Associates, LLC

(57) ABSTRACT

The invention relates to a method for compensation for any phase and/or amplitude error in a receiver having a complex processing branch and a complex-conjugate processing branch, wherein an error-compensated complex signal component is determined by subtraction of a complex-conjugate signal component and to which a correction parameter is applied, from a complex signal component. The correction parameter is determined on the basis of a function of a quotient of the complex signal component and the complex-conjugate signal component.

25 Claims, 3 Drawing Sheets

OTHER PUBLICATIONS

Yu et al., A Novel Adaptive Mismatch Cancellation System For Quadrature IF Radio Receivers, Jun. 1999, IEEE Transactions on Circuits and Systems,-Analog and Digital Signal Processing, vol. 46, No. 6, pp. 789-801.*

Yu et al., A Novel Adaptive Mismatch Cancellation System for Quadraure IF Radio Receivers, Jun. 1999, IEEE Transaction on Circuits and Systems-II Analog and Digital Signal Processing, vol. 46, No. 6, pp. 789-801.*

"A Novel Adaptive Mismatch Cancellation System for Quadrature IF Radio Receivers", Li Yu and W. Martin Snelgrove. IEEE Transactions on Circuits and Systems-II: Analog and Digital Signal Processing. vol. 46, No. 6, Jun. 1999, pp. 789-801.

"Correcting I-Q Imbalance in Direct Conversion Receivers", S. W. Ellingson, Feb. 10, 2003, Reprinted from the Internet at: http://www.ece.yt.edu/swe/argus/, 3 pgs.

* cited by examiner

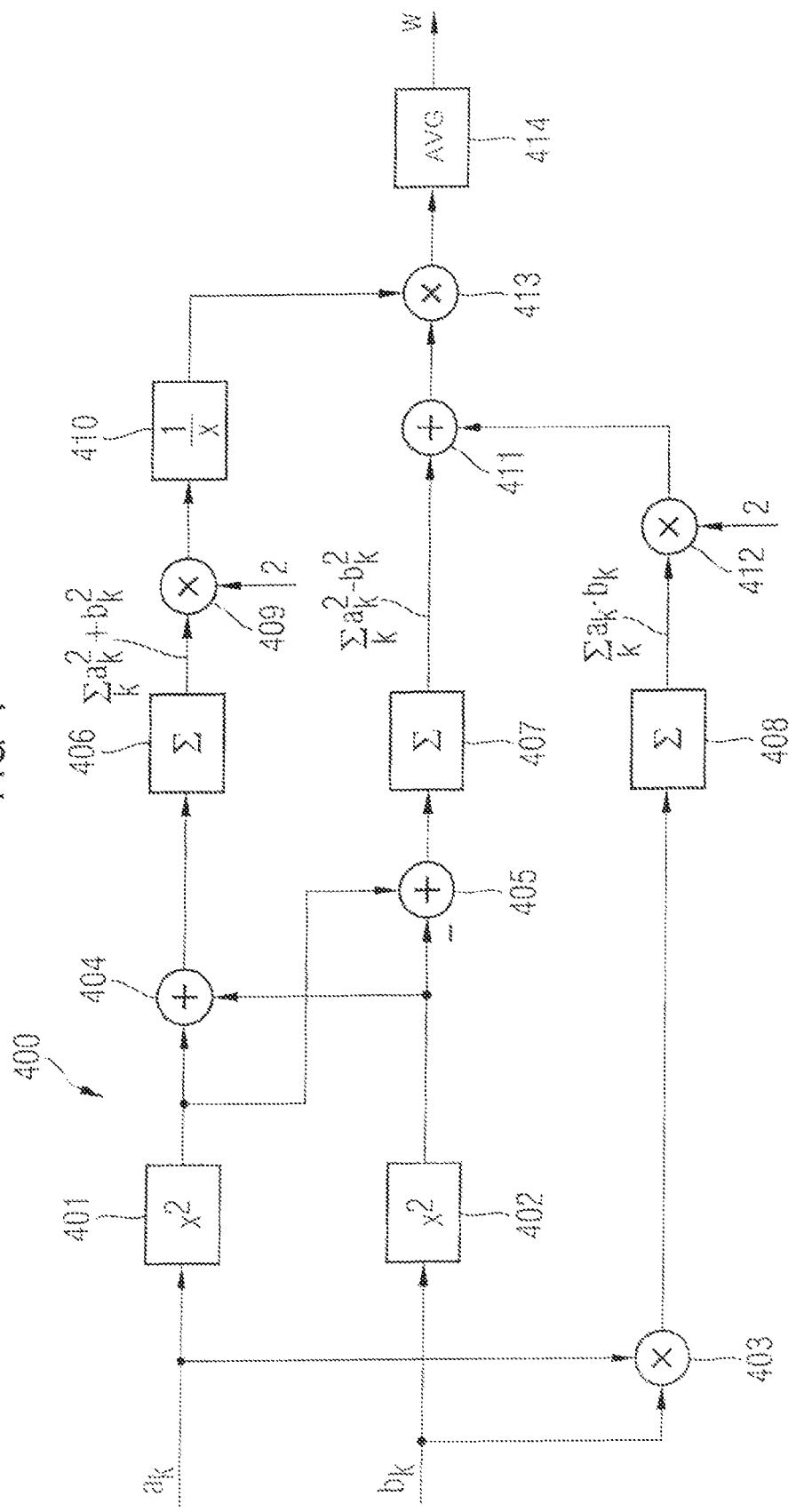

US 8,218,683 B2

METHOD FOR COMPENSATION FOR ANY PHASE AND/OR AMPLITUDE ERROR IN A RECEIVER

FIELD OF THE INVENTION

The invention relates to a method for compensation for any phase and/or amplitude error in a receiver having I and Q signal processing branches. The invention also relates to a related receiver.

BACKGROUND OF THE INVENTION

In the case of quadrature receivers, in which received signals are split into in-phase (I) and quadrature (Q) signal components, the phases and amplitudes of the I and Q signal components are frequently subject to a discrepancy from the ideal values. These discrepancies lead to distortion in the signal and, in the end, to a higher bit error rate, or to poorer reception quality.

BRIEF DESCRIPTION OF THE DRAWINGS

The invention will be explained in more detail in the following text using examples and with reference to the drawings, in which:

FIG. 4 is a block diagram illustrating a circuit for implementation of an algorithm for estimation of a correction parameter.

DETAILED DESCRIPTION OF THE INVENTION

According to one embodiment of the invention, a method is used for compensation for any phase and/or amplitude error in a receiver which has a complex signal processing branch and a complex-conjugate signal processing branch. In the method, an error-compensated complex signal component is determined, wherein a correction parameter is applied to a complex-conjugate signal component which is subject to an error, and is then subtracted from a complex signal component which is subject to an error. The correction parameter is estimated on the basis of a function of a quotient of the complex signal component, which is subject to an error, and the complex-conjugate signal component, which is subject to an error.

According to a further embodiment of the invention, a method is used for compensation for any phase and/or amplitude error in a receiver, with the receiver having I and Q signal processing branches. In this case, an error-compensated I signal component is determined by subtraction of a Q signal component, which is subject to an error and to which a correction parameter is applied, from an I signal component which is subject to an error. The correction parameter is determined using the equation $$w = E\left(\frac{z_{k,imb}}{z^*_{k,imb}}\right) \quad (1)$$

or an approximation to this equation, where E is an expected value, $z_{k,imb}$ is a value of the I signal component which is subject to an error at the discrete time k, and $z^*_{k,imb}$ is a value of the Q signal component, which is subject to an error, at the discrete time k.

Figure 1:
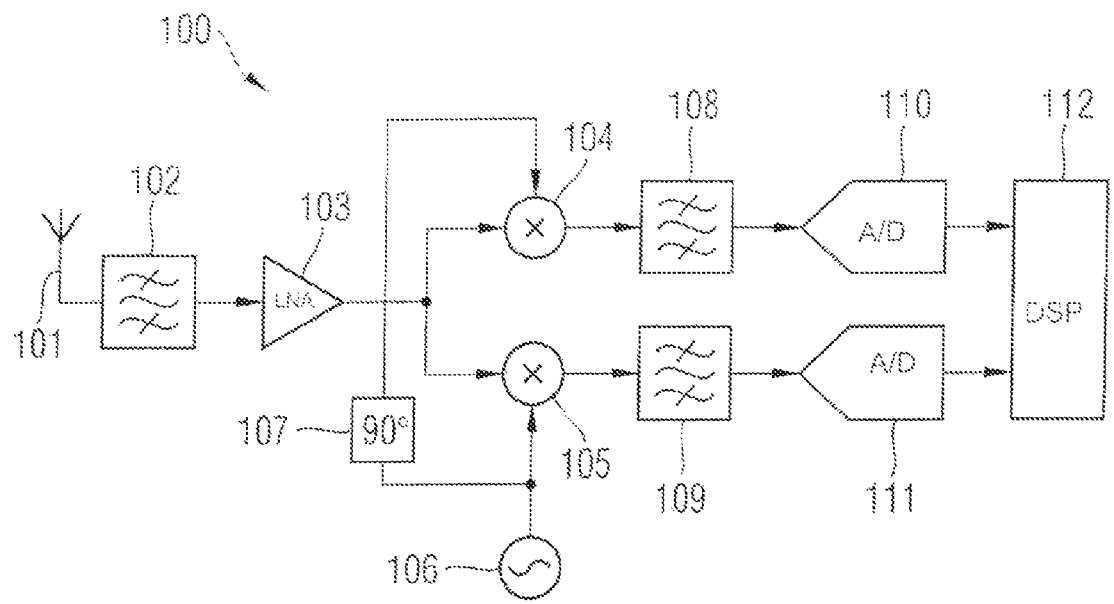
FIG. 1 is a block diagram of a receiver according to one exemplary embodiment of the invention.

FIG. 1 shows schematically and by way of example the reception path of a receiver 100 which is used, for example, in a mobile radio appliance. The receiver 100 is used as one exemplary embodiment of the invention. An antenna 101 receives modulated radio-frequency carrier signals, which then pass through a bandpass filter 102 and a low-noise amplifier (LNA) 103. The carrier signal that has been pre-processed in this way is down-mixed by means of two mixers 104 and 105. For this purpose, two ideally orthogonal mixer signals are produced by a local oscillator 106 and a phase shifter 107. The I and Q signal components which are produced by the phase-shifted down-mixing of the carrier signal are subjected to further filtering by means of bandpass filters 108 and 109, respectively, and are then converted to digital I and Q signal components, respectively, in analog/digital converters (A/D) 110 and 111. The digitized I and Q signal components are passed to a digital signal processor (DSP) 112 for further signal processing where, for example and inter alia, they are demodulated.

The frequency conversion of the radio-frequency carrier signals by means of the mixers 104 and 105 is carried out either directly to baseband, or to a low intermediate frequency. In this first case, this is referred to as a zero-IF receiver, while the second case is referred to as a low-IF receiver. In the case of a low-IF receiver, the final frequency conversion to baseband is carried out for example in the digital signal processor 112. Furthermore, it is also feasible to design the receiver 100 as a heterodyne receiver, in which the frequency conversion from the carrier frequency to baseband is carried out via two mixer stages.

In practice, the two mixer signals which are produced by the local oscillator 106 and the phase shifter 107 frequently do not have the desired 90° phase difference between them, but, for example, a phase difference in the range from 85° to 95°. This is the situation in particular in the case of zero-IF receivers and low-IF receivers, because of the very high mixing frequency that is required for these receiver types. Furthermore there is frequently an amplitude discrepancy between the I and Q signal components.

Figure 2A:
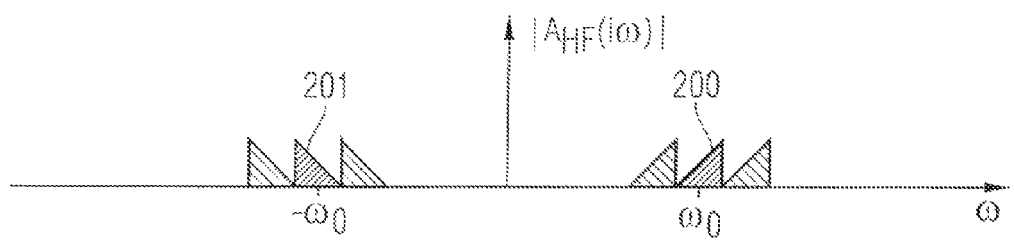
FIGS. 2A-2C are graphs illustrating effects of phase and amplitude errors.

FIG. 2 shows the effects of the phase and amplitude errors caused by the down-mixing to baseband, in a schematic form. The radio-frequency signals which are applied to the inputs of the mixers 104 and 105 are plotted against the frequency ω in FIG. 2A. The radio-frequency signal, which is annotated with the reference numeral 200 and is at the frequency $\omega_0$, is the desired radio-frequency signal. In addition, there is a further radio-frequency signal 201 at the mirror-image frequency $-\omega_0$.

Figure 2B:
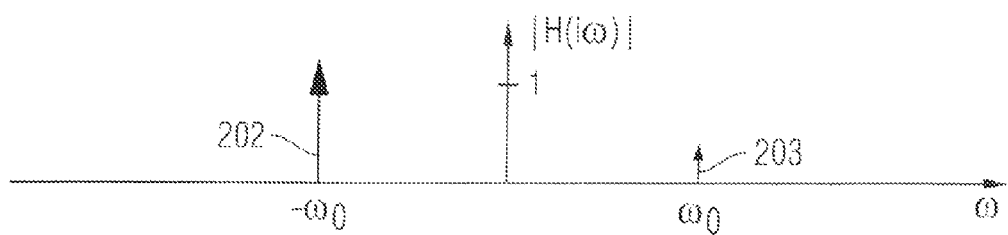

The transfer function of the mixers 104 and 105 is illustrated in FIG. 2B. A mixer signal 202 at the frequency $-\omega_0$ is used for down-mixing of the radio-frequency signal 200 to baseband. Furthermore, the phase and amplitude errors result in a further mixer signal 203 at the mirror-image frequency $\omega_0$.

Figure 2C:
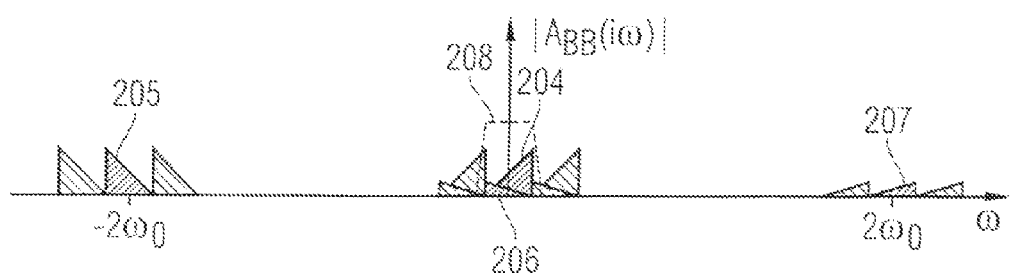

The signals which are produced from the radio-frequency signals 200 and 201 after passing through the mixers 104 and 105 are illustrated in FIG. 2C. The signals which are identified by the reference symbols 204 and 205 result from the mixing of the radio-frequency signals 200 and 201 with the mixer signal 202, with the signal 204 representing the desired baseband signal. Furthermore, signals 206 and 207 are produced by the mixing of the radio-frequency signals 200 and 201 with the mixer signal 203.

In the further signal processing, the signals 205 and 207 at the frequencies $-2\omega_0$ and $2\omega_0$, respectively, are removed from the I and Q signal components by the bandpass filters 108 and 109. FIG. 2C shows the transfer function 208 of the bandpass filters 108 and 109.

If the baseband signal 206 produced by the phase and amplitude errors is not eliminated, or at least reduced, this signal leads to distortion of the baseband signal and, in the end, to a higher bit error rate. In the present exemplary embodiment, the baseband signal 206 is therefore eliminated from the I and Q signal components, or is at least reduced. In one embodiment this is carried out in the digital section of the reception path, for example in the digital signal processor 112.

Figure 3:
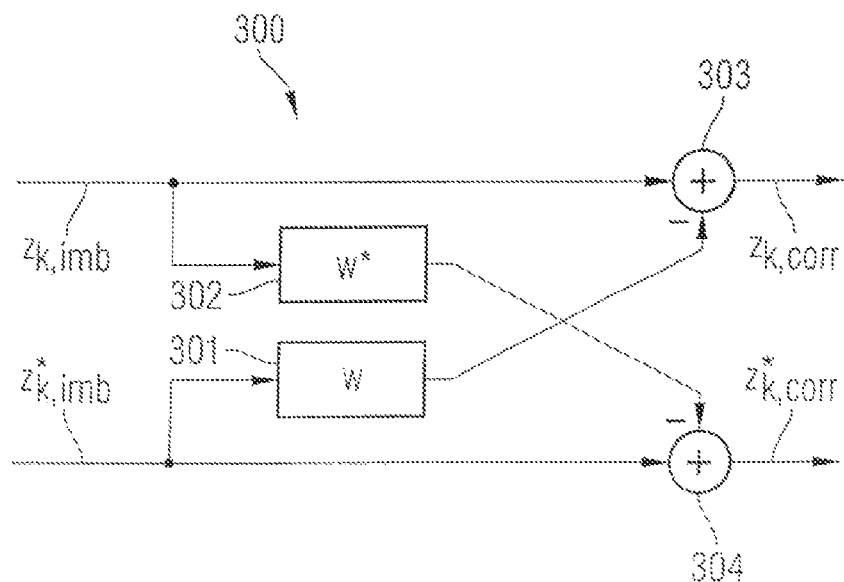
FIG. 3 is a block diagram illustrating a model to compensate for any phase and/or amplitude error.

FIG. 3 schematically illustrates a correction model 300, which describes the compensation for the phase and/or amplitude errors. The complex input values of the I signal component, which are subject to the error that is to be compensated for, are annotated $z_{k,imb}$, where k indicates the discrete time associated with the input value $z_{k,imb}$. The corresponding complex input values of the Q signal component are annotated $z^*_{k,imb}$, where the input value $z^*_{k,imb}$ represents the complex-conjugate of the input value $z_{k,imb}$.

In the case of the correction model 300, provision is made for the input values $z_{k,imb}$ and $z^*_{k,imb}$—as illustrated in FIG. 3—to be supplied to the inputs of a respective unit 301 or 302, and to a respective adder 303 or 304. Furthermore, the outputs of the units 301 and 302 are connected to further inputs of the respective adders 303 and 304. In the end, this means that input value $z_{k,imb}^*$ has a complex correction parameter w applied to it in the unit 301, for example by means of a multiplication operation in one embodiment, and is then subtracted from the input value $z_{k,imb}$. This results in an error-compensated value $z_{k,corr}$ of the I signal component at the output of the adder 303. In a corresponding manner, the input value $z_{k,imb}$ has the complex-conjugate correction parameter $w^*$ applied to it, for example by means of a multiplication operation, and is then subtracted from the input value $z^*_{k,imb}$ by means of the adder 304. The adder 304 emits an error-compensated value $z^*_{k,corr}$ of the Q signal component at its output. For example, in one embodiment the error-compensated values $z_{k,corr}$ and $z^*_{k,corr}$ of the respective I and Q signal components are:

$$z_{k,corr} = z_{k,imb} - W \cdot z_{k,imb}^* \quad (2)$$

$$z_{k,corr}^* = z_{k,imb}^* - W^* \cdot z_{k,imb} \quad (3)$$

The optimum correction parameter w is determined with the aid of an estimation algorithm which is explained in one embodiment below. The algorithm is based on the knowledge that the correction parameter w can be estimated by means of a function of the quotient of the values $z_{k,imb}$ and $z_{k,imb}^*$ which are subject to errors. By way of example, in one embodiment the correction parameter w can be estimated on the basis of the following equation (1), where E indicates the expected value:

$$w = E\left(\frac{z_{k,imb}}{z_{k,imb}^*}\right) \quad (4)$$

The complex values $z_{k,imb}$ and $z_{k,imb}^*$ can be described by means of their cartesian coordinates, as follows, where $a_k$ indicates the real part and $b_k$ indicates the imaginary part of the value $z_{k,imb}$ which is subject to an error:

$$z_{k,imb} = a_k + i \cdot b_k \quad (5)$$

$$z_{k,imb}^* = a_k - i \cdot b_k \quad (6)$$

Substitution of the equations (5) and (6) in equation (4) results in:

$$w = E\left(\frac{z_{k,imb}}{z_{k,imb}^*}\right) = E\left(\frac{a_k + i \cdot b_k}{a_k - i \cdot b_k}\right) \quad (7)$$

Equation (7) can be further reorganized, thus resulting in the following equation (8), in which the variable parameter $\delta$, for example, assumes the value 2:

$$w = E\left(\frac{a_k^2 - b_k^2 + i \cdot \delta \cdot a_k \cdot b_k}{a_k^2 + b_k^2}\right) \quad (8)$$

As can be seen from equation (8), the estimate of the correction parameter w includes three different terms, which can be assigned specific meanings. In this case, the term $a_k \cdot b_k$ describes the phase error, the term $a_k^2 - b_k^2$ describes the amplitude error, and the term $a_k^2 + b_k^2$ describes the normalization in the denominator.

By way of example, equation (8) can be used in the implementation of the algorithm for estimation of the correction parameter w to determine the correction parameter w for each input value $z_{k,imb}$ or $z_{k,imb}^*$. This is worthwhile, for example, in the event of a major fluctuation in the amplitude level of the received signals.

If it can be assumed that the probability density function of the input values $z_{k,imb}$ and $z_{k,imb}^*$ is constant, equation (8) can be stated as follows:

$$w = E\left(\frac{|a_k| - |b_k| + i \cdot \gamma \cdot 2 \cdot a_k \cdot b_k}{|a_k| + |b_k|}\right) \quad (9)$$

In equation (9), $\gamma$ denotes a variable parameter which depends on the respective probability density function.

The following equation (10), in which the variable parameters $\alpha$ and $\beta$ have, for example, the values $\alpha=0.5$ and $\beta=1$, indicates a further possible way to estimate the correction parameter w:

$$w = \frac{\alpha \cdot E(a_k^2 - b_k^2) + i \cdot \beta \cdot E(a_k \cdot b_k)}{E(a_k^2 + b_k^2)} \quad (10)$$

Equation (10) has the advantage that there is no need to carry out a division process for each input value $z_{k,imb}$ or $z_{k,imb}^*$, but that the input values $z_{k,imb}$ and $z_{k,imb}^*$ can first of all be combined, or an averaging process can be carried out, before carrying out a division process. A further advantage of equation (10) is the reduced variance of the estimator. Equation (10) can be implemented as an estimation algorithm, in particular in the situation in which the signals received by radio do not have any major sudden amplitude changes.

Furthermore, provided that the amplitude error between the I and the Q signal component can be ignored, the estimation algorithm can be simplified further:

$$w = \frac{i \cdot \beta \cdot E(a_k \cdot b_k)}{E(a_k^2 + b_k^2)}. \tag{11}$$

If the probability density function of the input values $z_{k,imb}$ and $z_{k,imb}*$ is known, the following equation (12) provides a further possible way to estimate the correction parameter w:

$$w = \frac{\mu \cdot E(|a_k| - |b_k|) + E(i \cdot v \cdot 2 \cdot a_k \cdot b_k)}{2 \cdot E(|a_k| + |b_k|)} \tag{12}$$

In equation (12), the variable parameters $\mu$ and $v$ depend on the probability density function of the input values $z_{k,imb}$ and $z_{k,imb}*$. Equation (12) has the advantage that no squares need be formed, that the number of division processes can be reduced, and that the variance of the estimator is reduced.

The first term in the numerator in equation (12) can be ignored if the amplitude error between the I and the Q signal component is sufficiently small.

$$w = \frac{E(i \cdot v \cdot a_k \cdot b_k)}{E(|a_k| + |b_k|)} \tag{13}$$

By way of example, FIG. 4 shows the implementation of equation (10). The algorithm for estimation of the correction parameter w is implemented in one embodiment in the digital signal processor 112. The components described in the following text may in this case be in the form of computation operations. In the present exemplary embodiment, the values $\alpha=0.5$ and $\beta=1$ are chosen for the parameters $\alpha$ and $\beta$.

In the circuit 400 illustrated in FIG. 4, an incoming real part $a_k$ is supplied to a squarer 401 and to a multiplier 403. An incoming imaginary part $b_k$ is supplied to a squarer 302 and to a further input of the multiplier 403. The outputs of the squarers 401 and 402 are respectively connected to inputs of adders 404 and 405, in which case care should be taken to ensure that the mathematical sign of the output value from the squarer 402 is inverted before the addition process by the adder 405. The adders 404 and 405 as well as the multiplier 403 are respectively followed by an adder 406, 407 and 408. The adders 406, 407 and 408 are used to add up a specific number of the values which arrive in them, before a quotient is formed from these values. The addition process reduces the output rate of the adders 406, 407 and 408 in comparison to their input rate.

The output value $$\sum_k a_k^2 + b_k^2$$

from the adder 406 is first of all multiplied by the factor 2 by means of a multiplier 409, and is then supplied to an inverter 410 which inverts the value supplied to it. The output value $$\sum_k a_k^2 - b_k^2$$

from the adder 407 is supplied to an adder 411, which adds this value to the output value $$\sum_k a_k \cdot b_k$$

from the adder 408, to which the factor 2 has already been applied by means of a multiplier 412. The outputs of the inverter 410 and of the adder 411 are connected to the inputs of a multiplier 413, which is in turn followed by an averaging unit (AVG) 414. In one embodiment the averaging unit 414 forms mean values of the values supplied to it over a variable averaging length, and emits the estimated value of the correction parameter w at its output.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

What is claimed is:

1. A method for compensation for a phase error, or an amplitude error, or both a phase error and an amplitude error, in a receiver having a complex signal processing branch and a complex-conjugate signal processing branch, comprising:

determining, using a determination element, an error-compensated complex signal component based on a difference between a complex signal component which is subject to an error and a complex-conjugate signal component which is subject to an error that is modified by a correction parameter; and estimating, using an estimation element, the correction parameter prior to the modification as a function of a quotient of the complex signal component and the complex-conjugate signal component, wherein before the formation of a quotient for estimation of the correction parameter, the method further comprises combining or averaging a plurality of values of the complex signal component or a plurality of values of the complex-conjugate signal component to form in each case one term.

2. The method of claim 1, wherein an error-compensated complex-conjugate signal component is determined based on a difference between a complex-conjugate signal component which is subject to an error and a complex-signal component which is subject to an error that is modified by a complex-conjugate correction parameter.

3. The method of claim 2, wherein the error-compensated complex signal component, or the error-compensated complex-conjugate signal component, or both, are calculated in a digital signal processing section of the complex and complex-conjugate signal processing branches of the receiver.

4. A method for compensation for a phase error, or an amplitude error, or both a phase error and an amplitude error, in a receiver having I and Q signal processing branches, comprising:

determining, using a determination element, an error-compensated I signal component based on a difference between a Q signal component which is subject to an error that is modified by a correction parameter w, and an I-signal component which is subject to an error; and determining the correction parameter w using the equation:

$$w = E\left(\frac{z_{k,imb}}{z_{k,imb}^*}\right)$$

or an approximation thereof, wherein E is an expected value, $z_{k,imb}$ is a value of the I signal component at a discrete time k, and $z_{k,imb}^*$ is a value of the Q signal component at the discrete time k, and wherein $z_{k,imb}$ and $z_{k,imb}^*$ are complex values.

5. The method of claim 4, further comprising determining an error-compensated Q signal component based on a difference between the I signal component that is modified by a complex-conjugate correction parameter, and the Q signal component which is subject to an error.

6. The method of claim 4, wherein the correction parameter w is determined using the equation:

$$w = E\left(\frac{|a_k| - |b_k| + i \cdot \gamma \cdot 2 \cdot a_k \cdot b_k}{|a_k| + |b_k|}\right)$$

and wherein $z_{k,imb} = a_k i + b_k$ and $z_{k,imb}^* = a_k - i \cdot b_k$, and $\gamma$ is a variable parameter, and wherein i is the imaginary number representation.

7. A method for compensation for a phase error, or an amplitude error, or both a phase error and an amplitude error, in a receiver having I and Q signal processing branches, comprising:

determining, using a determination element, an error-compensated I signal component based on a difference between a Q signal component which is subject to an error and is modified by a correction parameter w, and an I-signal component which is subject to an error; and determining the correction parameter based on real and imaginary components of the I and Q signal components:

wherein the correction parameter w is determined using the equation:

$$w = \frac{\alpha \cdot E(a_k^2 - b_k^2) + i \cdot \beta \cdot E(a_k \cdot b_k)}{E(a_k^2 + b_k^2)}$$

or an approximation thereof, wherein E is an expected value, $a_k$ and $b_k$ are the real and imaginary values, respectively, of the I signal component at a discrete time k, and $\alpha$ and $\beta$ are variable parameters, and wherein i is the imaginary number representation.

8. The method according to claim 7, wherein the correction parameter w is determined using the equation:

$$w = \frac{i \cdot \beta \cdot E(a_k \cdot b_k)}{E(a_k^2 + b_k^2)},$$

wherein E is an expected value, $a_k$ and $b_k$ are the real and imaginary values, respectively, of the I signal component at a discrete time k, wherein $\beta$ is a variable parameter, and wherein i is the imaginary number representation.

9. A method for compensation for a phase error, or an amplitude error, or both a phase error and an amplitude error, in a receiver having I and Q signal processing branches, comprising:

determining, using a determination element, an error-compensated I signal component by subtracting a Q signal component which is subject to an error and that is modified by a correction parameter w from an I-signal component which is subject to an error; and determining the correction parameter based on real and imaginary components of the I or Q signal components, or both;

wherein the correction parameter w is determined by:

$$w = \frac{\mu \cdot E(|a_k| - |b_k|) + E(i \cdot \nu \cdot 2 \cdot a_k \cdot b_k)}{2 \cdot E(|a_k| + |b_k|)}$$

or an approximation thereof, wherein E is an expected value, $a_k$ and $b_k$ are values of the I and Q signal components, respectively, at a discrete time k, and $\mu$ and $\nu$ are variable parameters, and wherein i is the imaginary number representation.

10. The method of claim 9, wherein the correction parameter w is determined using the equation:

$$w = \frac{E(i \cdot \nu \cdot a_k \cdot b_k)}{E(|a_k| + |b_k|)},$$

wherein E is an expected value, $a_k$ and $b_k$ are values of the I and Q signal components, respectively, at a discrete time k, and wherein $\nu$ is a variable parameter, and wherein i is the imaginary number representation.

11. A receiver, comprising:
a complex signal processing branch;
a complex-conjugate signal processing branch; and
a calculation unit configured to determine an error-compensated complex signal component based on a difference between a complex-conjugate signal component which is subject to an error and that is modified by a correction parameter, and a complex signal component which is subject to an error, and further configured to estimate the correction parameter as a function of a quotient of the complex signal component and the complex-conjugate signal component,
wherein before the formation of a quotient for estimation of the correction parameter, the calculation unit is configured to combine or average a plurality of values of the complex signal component or a plurality of values of the complex-conjugate signal component, or both, to form in each case one term.

12. The receiver of claim 11, wherein the calculation unit is further configured to determine an error-compensated complex-conjugate signal component based on a difference between a complex signal component which is subject to an error and modified by a complex-conjugate correction parameter, and a complex-conjugate signal component which is subject to an error.

13. The receiver of claim 11, wherein the calculation unit comprises a digital signal processor.

14. A receiver, comprising:
an I signal processing branch;
a Q signal processing branch; and
a calculation unit configured to determine an error-compensated I signal component based on a difference between a Q signal component which is subject to an error that is modified by a correction parameter, and an I signal component which is subject to an error, and further configured to determine a correction parameter w using the equation:

$$w = E\left(\frac{z_{k,imb}}{z_{k,imb}^*}\right)$$

or an approximation thereof, wherein E is an expected value, $z_{k,imb}$ is a value of the I signal component at a discrete time k, and $z_{k,imb}^*$ is a value of the Q signal component at the discrete time k, and wherein $z_{k,imb}$ and $z_{k,imb}^*$ are complex values.

15. The receiver of claim 14, wherein the calculation unit is further configured to determine an error-compensated Q signal component based on a difference between the I signal component that is modified by a complex-conjugate correction parameter, and the Q signal component.

16. The receiver of claim 14, wherein the calculation unit is configured to determine the correction parameter w using the equation:

$$w = E\left(\frac{|a_k| - |b_k| + i \cdot \gamma \cdot 2 \cdot a_k \cdot b_k}{|a_k| + |b_k|}\right),$$

and wherein $z_{k,imb}=a_k+i\cdot b_k$ and $z_{k,imb}^*=a_k-i\cdot b_k$ and $\gamma$ is a variable parameter, and wherein i is the imaginary number representation.

17. A receiver, comprising:
an I signal processing branch;
a Q signal processing branch; and
a calculation unit configured to determine an error-compensated I signal component by subtraction of a Q signal component which is subject to an error and to which a correction parameter w is applied, from an I signal component which is subject to an error, and further configured to determine the correction parameter w using real and imaginary components of the I or Q signal components, or both;
wherein the calculation unit is configured to determine the correction parameter according to the equation:

$$w = \frac{\alpha \cdot E(a_k^2 - b_k^2) + i \cdot \beta \cdot E(a_k \cdot b_k)}{E(a_k^2 + b_k^2)}$$

or an approximation thereof, wherein E is an expected value, $z_{k,imb}=a_k+i\cdot b_k$ is a value of the I signal component at a discrete time k, $z_{k,imb}^*=a_k-i\cdot b_k$ is a value of the Q signal component at the discrete time k, and $\alpha$ and $\beta$ are variable parameters, and wherein i is the imaginary number representation.

18. The receiver of claim 17, wherein the calculation unit is further configured to determine the correction parameter w using the equation:

$$w = \frac{i \cdot \beta \cdot E(a_k \cdot b_k)}{E(a_k^2 + b_k^2)},$$

wherein $\beta$ is a variable parameter, and wherein i is the imaginary number representation.

19. The receiver of claim 17, wherein the calculation unit is further configured to determine the correction parameter using the equation:

$$w = \frac{\mu \cdot E(|a_k| - |b_k|) + E(i \cdot \nu \cdot 2 \cdot a_k \cdot b_k)}{2 \cdot E(|a_k| + |b_k|)}$$

or an approximation thereof, wherein E is an expected value, $z_{k,imb}=a_k+i\cdot b_k$ is a value of the I signal component, which is subject to an error, at a discrete time k, $z_{k,imb}^*=a_k-i\cdot b_k$ is a value of the Q signal component, which is subject to an error, at the discrete time k, and $\mu$ and $\nu$ are variable parameters, and wherein i is the imaginary number representation.

20. The receiver of claim 17, wherein the calculation unit is configured to determine the correction parameter w using the equation:

$$w = \frac{E(i \cdot \nu \cdot a_k \cdot b_k)}{E(|a_k| + |b_k|)},$$

wherein E is an expected value, $z_{k,imb}=a_k+i\cdot b_k$ is a value of the I signal component, which is subject to an error, at a discrete time k, $z_{k,imb}^*=a_k-i\cdot b_k$ is a value of the Q signal component, which is subject to an error, at the discrete time k, wherein $\nu$ is a variable parameter, and wherein i is the imaginary number representation.

21. A method for compensation for a phase error, or an amplitude error, or both a phase error and an amplitude error, in a receiver having I and Q signal processing branches, comprising:
determining, using a determination element, an error-compensated I signal component based on a difference between a Q signal component which is subject to an error and is modified by a correction parameter w, and an I-signal component which is subject to an error; and
determining the correction parameter based on real and imaginary components of the I and Q signal components;
wherein the correction parameter w is determined using the equation:

$$w = \frac{i \cdot \beta \cdot E(a_k \cdot b_k)}{E(a_k^2 + b_k^2)},$$

wherein E is an expected value, $a_k$ and $b_k$ are the real and imaginary values.

22. A method for compensation for a phase error, or an amplitude error, or both a phase error and an amplitude error, in a receiver having I and Q signal processing branches, comprising:
determining, using a determination element, an error-compensated I signal component by subtracting a Q signal component which is subject to an error and that is modified by a correction parameter w from an I-signal component which is subject to an error; and determining the correction parameter based on real and imaginary components of the I or Q signal components, or both;

wherein the correction parameter w is determined using the equation:

$$w = \frac{E(i \cdot v \cdot a_k \cdot b_k)}{E(|a_k| + |b_k|)},$$

wherein E is an expected value, $a_k$ and $b_k$ are values of the I and Q signal components, respectively, at a discrete time k, and wherein v is a variable parameter, and wherein i is the imaginary number representation.

23. A receiver, comprising:
an I signal processing branch;
a Q signal processing branch; and
a calculation unit configured to determine an error-compensated I signal component by subtraction of a Q signal component which is subject to an error and to which a correction parameter w is applied, from an I signal component which is subject to an error, and further configured to determine the correction parameter w using real and imaginary components of the I or Q signal components, or both;
wherein the calculation unit is further configured to determine the correction parameter w using the equation:

$$w = \frac{i \cdot \beta \cdot E(a_k \cdot b_k)}{E(a_k^2 + b_k^2)},$$

wherein $\beta$ is a variable parameter, and wherein i is the imaginary number representation.

24. A receiver, comprising:
an I signal processing branch;
a Q signal processing branch; and
a calculation unit configured to determine an error-compensated I signal component by subtraction of a Q signal component which is subject to an error and to which a correction parameter w is applied, from an I signal component which is subject to an error, and further configured to determine the correction parameter w using real and imaginary components of the I or Q signal components, or both;

wherein the calculation unit is further configured to determine the correction parameter using the equation:

$$w = \frac{\mu \cdot E(|a_k| - |b_k|) + E(i \cdot v \cdot 2 \cdot a_k \cdot b_k)}{2 \cdot E(|a_k| + |b_k|)}$$

or an approximation thereof, wherein E is an expected value, $z_{k,imb=ak}+i \cdot b_k$ is a value of the I signal component, which is subject to an error, at a discrete time k, $z_{k,imb}{}^*=a_k-i \cdot b_k$ is a value of the Q signal component, which is subject to an error, at the discrete time k, and $\mu$ and $v$ are variable parameters, and wherein i is the imaginary number representation.

25. A receiver, comprising:
an I signal processing branch;
a Q signal processing branch; and
a calculation unit configured to determine an error-compensated I signal component by subtraction of a Q signal component which is subject to an error and to which a correction parameter w is applied, from an I signal component which is subject to an error, and further configured to determine the correction parameter w using real and imaginary components of the I or Q signal components, or both;
wherein the calculation unit is configured to determine the correction parameter w using the equation:

$$w = \frac{E(i \cdot v \cdot a_k \cdot b_k)}{E(|a_k| + |b_k|)},$$

wherein E is an expected value, $z_{k,imb}=a_k+i \cdot b_k$ is a value of the I signal component, which is subject to an error, at a discrete time k, $z_{k,imb}{}^*=a_k-i \cdot b_k$ is a value of the Q signal component, which is subject to an error, at the discrete time k, wherein v is a variable parameter, and wherein i is the imaginary number representation.

* * * * *